(12) United States Patent
Schwabedissen et al.

(10) Patent No.: US 12,707,755 B2
(45) Date of Patent: Aug. 11, 2026

(54) METHOD FOR PRODUCING A SOLAR CELL

(71) Applicant: HANWHA Q CELLS GMBH, Bitterfeld-Wolfen (DE)

(72) Inventors: Axel Schwabedissen, Bitterfeld-Wolfen (DE); Matthias Junghänel, Bitterfeld-Wolfen (DE); Kyung Hun Kim, Bitterfeld-Wolfen (DE); Fabian Fertig, Bitterfeld-Wolfen (DE)

(73) Assignee: Hanwha Q Cells GmbH, Bitterfeld-Wolfen (DE)

( * ) Notice: Subject to any disclaimer, the term of this patent is extended or adjusted under 35 U.S.C. 154(b) by 792 days.

(21) Appl. No.: 18/006,234

(22) PCT Filed: Jul. 21, 2021

(86) PCT No.: PCT/DE2021/100633

§ 371 (c)(1),
(2) Date: Mar. 23, 2023

(87) PCT Pub. No.: WO2022/017565

PCT Pub. Date: Jan. 27, 2022

(65) Prior Publication Data

US 2024/0038909 A1 Feb. 1, 2024

(30) Foreign Application Priority Data

Jul. 21, 2020 (DE) ..................... 10 2020 119 206.1

(51) Int. Cl.
*H10F 77/20* (2025.01)
*C23C 16/24* (2006.01)
(Continued)

(52) U.S. Cl.
CPC ............ *H10F 77/211* (2025.01); *C23C 16/24* (2013.01); *C23C 16/325* (2013.01);
(Continued)

(58) Field of Classification Search
CPC ........ H10F 10/14; H10F 71/00; H10F 71/121; H10F 71/131; H10F 71/137; H10F 77/20;
(Continued)

(56) References Cited

U.S. PATENT DOCUMENTS 5,981,353 A * 11/1999 Tsai .................. H01L 21/76224 257/E21.546
2004/0241461 A1* 12/2004 Maurice ............ H01L 21/76254 428/689

(Continued)

FOREIGN PATENT DOCUMENTS

CN 108701727 A 10/2018
CN 109802007 A 5/2019

(Continued)

OTHER PUBLICATIONS

Landheer, Kees, et al., "Comparison of batch and in-line PECVD of a-Si:H passivation layers for silicon heterojunction solar cells," Phys. Status Solidi RRL, vol. 10, No. 10, pp. 725-729 (2016).

*Primary Examiner* — Brook Kebede
(74) *Attorney, Agent, or Firm* — Christensen, Fonder, Dardi & Busse PLLC; John P. Fonder

(57) ABSTRACT

A method for producing a solar cell, including the following steps: a) providing a substrate having a front side and a back side in a deposition apparatus, and b) coating the substrate in situ with two layers, including b1) oxidizing, by exposing the substrate to an oxygen-containing gas and a first plasma, to create an oxide layer and b2) subsequently depositing a silicon layer or SiC layer by exposure to a gas containing silicon, an optional gas containing carbon and a second plasma, wherein step b) is carried out under vacuum in the deposition apparatus and the vacuum is maintained continuously during step b).

20 Claims, 3 Drawing Sheets

(51) Int. Cl.

| | |
|---|---|
| ***C23C 16/32*** | (2006.01) |
| ***C23C 16/40*** | (2006.01) |
| ***C23C 16/50*** | (2006.01) |
| ***C23C 16/56*** | (2006.01) |
| ***H10F 77/30*** | (2025.01) |

(52) U.S. Cl.
CPC .......... *C23C 16/401* (2013.01); *C23C 16/403* (2013.01); *C23C 16/50* (2013.01); *C23C 16/56* (2013.01); *H10F 77/311* (2025.01)

(58) Field of Classification Search
CPC ...... H10F 77/211; H10F 77/30; H10F 77/311; C23C 16/24; C23C 16/32; C23C 16/325; C23C 16/40; C23C 16/401; C23C 16/402; C23C 16/403; C23C 16/50; C23C 16/56; H01J 37/32; H01J 37/34; Y02E 10/547; Y02P 70/50
See application file for complete search history.

(56) References Cited

U.S. PATENT DOCUMENTS

| | | | | |
|---|---|---|---|---|
| 2007/0256728 | A1* | 11/2007 | Cousins ................ | H10F 77/935 136/252 |
| 2013/0186464 | A1 | 7/2013 | Sheng et al. | |
| 2014/0299187 | A1* | 10/2014 | Chang ................... | H10F 77/311 136/258 |
| 2018/0138334 | A1* | 5/2018 | Lee ....................... | H10F 77/244 |
| 2018/0277701 | A1 | 9/2018 | Lenes et al. | |

FOREIGN PATENT DOCUMENTS

| | | | | |
|---|---|---|---|---|
| CN | 110931604 A | 3/2020 | | |
| CN | 111106183 A | 5/2020 | | |
| DE | 10 2018 124 565 A1 | 4/2020 | | |
| KR | 101396445 B1 * | 5/2014 | ............. | H10F 71/00 |

* cited by examiner 21
1
2
22

21
1
2
22
3

21
1
2
22
3
4

METHOD FOR PRODUCING A SOLAR CELL

RELATED APPLICATIONS

The present application is a National Phase entry of PCT Application No. PCT/DE2021/100633, filed Jul. 21, 2021, which claims priority to German Patent Application No. 10 2020 119 206.1, filed Jul. 21, 2020, the disclosures of which are hereby incorporated by reference herein in their entirety.

FIELD OF THE INVENTION

The invention relates to a method for producing a solar cell. More particularly the invention relates to a solar cell production method which features chemical vapor deposition (CVD).

BACKGROUND OF THE INVENTION

One such method is described in U.S. Pat. No. 10,243,090 B2, in which a tunnel layer in oxide form and subsequently a doped semiconductor layer are deposited on a substrate by LPCVD (low pressure chemical vapor deposition or low-pressure CVD). A disadvantage with this method is a low deposition rate for the doped semiconductor layer, leading to a loss of throughput and to an increase in operating costs.

SUMMARY

It is therefore an object of the invention to provide a method for producing a solar cell that is cost-effective.

This object is achieved by a method having the features of the claims. Advantageous developments and modifications are elucidated in the dependent claims.

The invention relates to a method for producing a solar cell, comprising steps as follows:

a) providing a substrate having a front side and a back side in a deposition apparatus, and b) coating the substrate in situ with two layers, comprising b1) oxidizing the substrate by exposing it to an oxygen-containing gas and to a first plasma, to generate an oxide layer, or depositing an oxide layer by PECVD, and b2) subsequently depositing a silicon layer or SiC-(silicon carbide) layer by exposure to a silicon-containing gas, an optional carbon-containing gas and a second plasma, where step b) is carried out under vacuum in the deposition apparatus and the vacuum is maintained throughout step b).

The method is carried out by plasma oxidation in step b1) and PECVD (plasma enhanced chemical vapor deposition) in step b2) in a first method variant. The plasma oxidation in the first method variant is not a PECVD step, since it involves no layer-forming gas. Instead the substrate is oxidized at a surface, with radicals or oxygen ions formed in the plasma penetrating the substrate. Alternatively the method is carried out exclusively by PECVD in steps b1) and b2), in a second method variant. In the second method variant, step b1) is carried out using the oxygen-containing gas in combination with a layer-forming gas, and so an oxide layer is deposited on the substrate. With the two above method variants, step b2) is carried out preferably directly after step b1) and/or preferably in the same deposition apparatus, so that there is no need for loading and unloading procedures and evacuating and aerating procedures between the generation of the two layers in step b). This additionally saves on time and costs. The oxide layer generated in step b1) is preferably configured thinly. The layer thickness is preferably in the range of 1-2 nm, more preferably 1.2-1.5 nm. The layer thickness generated in step b2) may be situated, for example in the range from 20 to 200 nm. The layer deposited in step b2) may be amorphous.

By low-pressure plasma in an oxygen-containing gas mixture, a relatively high concentration of reactive, atomic oxygen or of oxygen ions ($O^-$, $O_2^-$) comes about in step b1), leading to the formation of an oxide layer on the substrate surface. Alternatively a thin oxide layer (e.g., silicon oxide layer) may be deposited by PECVD using a layer-forming gas (e.g., silane=$SiH_4$) and an oxidizing gas (e.g., $CO_2$, $N_2O$ or $O_2$).

As well as a "pure" oxide layer, which contains no extraneous atoms or contains such atoms in the range of error tolerances, the oxide layer generated in step b1) may further be configured as a doped or nitrided oxide layer. For example, the oxide layer generated in step b1) may be a layer doped with phosphorus or boron. In that case, for the doping, in step b1) as well as the oxygen-containing gas (mixture) and optionally layer-forming gas, a phosphorus-containing gas is additionally used, such as phosphine ($PH_3$) or diborane ($B_2H_6$), for example. For nitriding the oxide layer, a PECVD method using $SiH_4$ and $N_2O$ may be employed.

The oxide layer is preferably a silicon oxide layer. In that case the layer-forming gas used may comprise silane. The silicon oxide layer may alternatively be generated by oxidation of a silicon substrate. With alternative preference it is an aluminum oxide layer. In that case the layer-forming gas used preferably comprises trimethylaluminum (TMAl) and the oxygen-containing gas or oxidant used comprises $N_2O$.

On account of the similar operating temperatures and operating pressures needed to generate the two layers generated in step b), there is also no need for costly and inconvenient heating and cooling times or evacuation/aeration operations in the method of the invention; all that is necessary is for the operating gases to be changed between step b1) and step b2).

The first plasma and the second plasma may be operated with the same or with different operating parameters.

Step b) is carried out under vacuum in the deposition apparatus, with the vacuum being maintained throughout step b). This means that between steps b1) and b2) there is no complete aeration procedure carried out, leading to an atmospheric pressure in the deposition apparatus. Between steps b1) and b2), however, the pressure in the deposition apparatus may change, but the vacuum is not interrupted. The pressure in the deposition apparatus during step b) is preferably kept below, for example, 10 mbar.

The back side of the substrate is preferably subjected to steps a) and b). As a result the back side may be provided with a tunnel layer and/or a surface passivation.

Preferably between steps b1) and b2) the substrate is not moved spatially within the deposition apparatus. In other words, the deposition takes place in one and the same operating chamber. The method is configured as a batch method.

In one preferred embodiment, step b) is carried out with a low-pressure plasma having a pressure in the range from 0.1 to 5.0 mbar or 0.1 to 10.0 mbar. An advantage of a low-pressure plasma method is that the plasma is distributed more uniformly in the deposition apparatus, the consumption of operating gas is relative low, and the operating temperature is relatively low.

Step b) is carried out preferably with a low-pressure glow discharge (low-pressure plasma) having an excitation frequency in the range from 10 to 500 kHz or 30 to 50 kHz. An advantage of the low-pressure glow discharge is that the energy for the splitting (dissociation) of the layer-forming/oxidizing molecules is accomplished not through the external supply of heat, but instead by accelerated electrons in the plasma, meaning that the operation can be carried out at significantly lower temperatures (down to a few hundred kelvins) than an LPCVD method or a thermal oxide.

Implementing the method under low-pressure plasma or low-pressure glow discharge results in a nonthermal process, meaning that the gas temperature is significantly lower than the temperature of the electrons.

In step b) the plasma is preferably operated in pulsed mode, with a duty cycle of $T_{on}/(T_{off}+T_{on})<10\%$, with $T_{on}$ being the time for which the plasma is ignited, and $T_{off}$ the time for which the plasma is off. As a result, the deposition rate is kept relatively low in order to accommodate operational fluctuations. This may also be realized by reducing the peak plasma power. In step b) the plasma is preferably pulsed in the region of $T_{on}$=1 to 10 ms or $T_{off}$=10 to 100 ms. This generates the layers in step b) in a satisfactory way.

In one preferred embodiment, the oxygen-containing gas is selected from the group consisting of

- $O_2$,
- a gas mixture of $O_2$/inert gas, the inert gas being preferably Ar, Ne, Kr or $N_2$, more preferably Ar or $N_2$,
- an oxygen-containing molecular gas, which is preferably $N_2O$, $CO_2$, $NO_2$, NO or CO,
- a layer-forming gas mixture, the layer-forming gas mixture being preferably $SiH_4O_2$, $SiH_4/CO_2$, $Al(CH_3)_3/N_2O$ or $AlC_3H_9/N_2O$/Ar.

The oxygen-containing gas is preferably pure oxygen. This saves on operating costs, owing to the absence of further gases. Where the molecular, oxygen-containing gases such as $N_2O$ or $CO_2$ are used, the deposition rate can be reduced and in this way a better homogeneity of the oxide layer over the entire substrate surface can be obtained. When the layer-forming gas mixtures are used, the deposition rate can be increased or an oxide layer can be generated that is not an oxidized material of the substrate. The substrate is preferably a silicon substrate. The oxide layer is preferably a silicon oxide layer or aluminum oxide layer. More preferably the oxide layer is a silicon oxide layer.

The silicon-containing gas and the optional carbon-containing gas are preferably selected from the group consisting of a gas mixture of $SiH_4/H_2$, a gas mixture of $SiH_4/H_2$/doping gas such as a gas mixture of $SiH_4/H_2/PH_3$ or a gas mixture of $SiH_4/H_2/B_2H_6$, a gas mixture of $SiH_4/CH_4$, a gas mixture of $SiH_4/CH_4$/doping gas such as, for example, $SiH_4/CH_4/PH_3$ or a gas mixture of $SiH_4/CH_4/B_2H_6$. The layer generated in step b2) may be doped, that is with a dopant. The dopant may be selected from B, In, Ga, Al, P, Sb, As. The dopant is preferably B. More preferably the dopant is P. The doping may also be carried out in an operating step separate from step b2). Preferably, however, the doped silicon or SiC layer is generated in step b2), meaning that layer formation and doping take place in one step. The silicon or SiC layer generated in step b2) is preferably amorphous or substantially amorphous. The silicon layer is preferably generated in step b2).

Step b1) is carried out preferably with a deposition rate of <0.2 nm/s or <0.1 nm/s. The oxide layer is therefore deposited at a relatively low deposition rate, in order to accommodate operational fluctuations in the contexts, for example, of plasma ignition. Glow discharges in $O_2$ (as an electronegative gas) tend toward instability as a result, for example, of constriction and/or filament formation). A relatively high deposition rate>0.1 nm/s may lead, in the event of operational instabilities such as problems with the ignition of a uniform plasma and/or arcing, to critical deviations of layer thickness from the target value preferably in the range of 1-2 nm, more preferably 1.2 to 1.5 nm. Even deviations of 0.5 nm from the target layer thickness value can lead to a loss in the efficiency Ncell of >1% (abs.). Particularly for mass manufacture, this is unacceptable. Step b1) is preferably carried out with a duty cycle<5%.

Step b1) is preferably carried out at a temperature<500° C. or in the range from 300 to 450° C. The oxide can be generated at a substantially lower temperature than a thermal oxide. This avoids long heating times.

In one preferred embodiment, two or more substrates are subjected simultaneously to steps a) and b). Preferably two or more substrates are subjected simultaneously to steps a) and b) without the substrates being spatially moved. This additionally saves on time in mass manufacture. The substrates may be n-type or p-type substrates. The substrate is configured preferably as a wafer, more preferably as an n-type wafer.

The two or more substrates are preferably arranged in a boat in which pairs of substrates are arranged oppositely and have a different polarity. The boat is configured preferably as a wafer boat. This may be a horizontal or vertical boat. The boat has a plurality of carrier plates arranged parallel to one another for carrying the two or more substrates during steps a) and b), with the carrier plates isolated from one another and connected alternately to connections of an alternating-current generator. The carrier plates preferably have a suitable mount, such as, for example, substrate pockets, retaining pins or the like, in order to hold the substrates, and individual substrates in the retaining apparatus must be held at a distance from one another in order to enable extremely uniform flow of gases through all of the interstices and the formation of a plasma between the substrates in order to ensure uniform coating of the substrates. Between adjacent carrier plates, moreover, there must be no conducting connection, so that there is no power loss and so that the alternating voltage needed for igniting the plasma can be applied. The retaining apparatus therefore comprises electrically insulating spacers which are arranged between the carrier plates and are configured to distance the carrier plates from one another and to insulate them electrically from one another. The substrates are arranged on the carrier plates in such a way that pairs of substrates are in electrical isolation from one another oppositely and are in electrically conducting connection to connectors of an alternating-voltage generator.

In one preferred embodiment, the boat is formed of a base material selected from the group consisting of graphite, carbon fiber-reinforced plastic or carbon fiber-reinforced carbon. Further base material candidates include carbides, quartz or ceramic. With particular preference the base material is graphite. The base material may be uncoated. The base material may alternatively be provided with a coating, preferably an oxygen-resistant coating, especially if the base material is graphite. A graphite base material has proven particularly appropriate in practice, especially in the coating of substrates for the purpose of producing semiconductor components such as solar cells.

The boat/the wafer retaining apparatus is preferably not moved spatially between steps b1) and b2), thus remaining in one and the same tube of the PECVD deposition apparatus. This has the advantage that there is no need for aerating times and pumped-removal times and also loading and unloading cycles between steps b1) and b2) at all, and largely no need for heating and cooling times.

It is, however, also conceivable for the boat/the wafer retaining apparatus to be moved spatially between steps b1) and b2), if the two steps take place in two different operating chambers separated by a vacuum lock. This may be, for example, in an inline plant, where the operating gases must be supplied with spatial separation.

In one preferred embodiment, the oxide layer generated in step b1) is configured as a tunnel layer or interface oxide layer. The oxide layer generated in step b1) preferably has a low layer thickness, situated for example in the range of 1-2 nm, preferably 1.2-1.5 nm, as a target value. The layer thickness generated in step b2) may be situated, for example, in the range from 20 to 200 nm.

The solar cell is preferably a TopCon (tunnel oxide passivated contact) solar cell. The TopCon solar cell is highly efficient and has an outstanding efficiency. Moreover, there is no need for the patterning or pointwise contacting of the back side of the substrate that is necessary in the case of cell technologies such as PERC (passivated emitter and rear cell). The back side coating comprises the layers generated in step b), with the silicon or SiC layer generated in step b2) being doped, and comprises a back side metallization or metal contact disposed on said layer. On the back side coating there may additionally be a further dielectric passivating layer system applied, composed of silicon nitride and/or silicon oxynitride, for example, which is then provided with the back side metallization. The back side metal contact may be implemented in a screen-printing process; contacting with the optionally doped silicon layer deposited in step b2) is accomplished preferably by "firing" of the passivating layer system. Firing preferably comprises the local application of a metal paste that eats through the passivating layer system, and exposure of the substrate thus coated at temperatures>700° C. (in a firing oven, for example). Also conceivable alternatively is a local opening of the passivating layer system at numerous locations, by means of laser methods, for example, in order to contact the back side metal contact or metallization with the doped silicon layer or SiC layer.

In one preferred embodiment the method is carried out as a direct plasma process with an excitation frequency of between 10 and 500 kHz. A denser coating is generated in this way than with indirect, so-called "remote" plasmas. In the case of the direct plasma process, the plasma burns directly between two substrates to be coated or between the electrode and one substrate, whereas in the case of an indirect plasma or a remote plasma process, the plasma burns in a separated chamber.

The operating pressure is in the range between 0.1 and 10 mbar, preferably in the range between 0.5 and 2 mbar.

The method may alternatively be carried out as a direct or remote plasma process with a capacitive or inductive plasma as radiofrequency plasma having an excitation frequency in the range from 10 to 100 MHz, as for example in a "showerhead" parallel-plate configuration with an excitation frequency of preferably 13.56 MHz. With these plasma processes, the operating pressure is in the range between 1e-3 mbar and 10 mbar, preferably in the range between 0.01 and 5 mbar.

In one preferred embodiment, before step a) with the substrate first a wet-chemical treatment, then a doping of the front side and subsequently a further wet-chemical treatment are carried out and after step b) with the substrate an annealing (=tempering) then optionally yet a further wet-chemical treatment of the front side, subsequently a passivation of the front side and of the back side and then a metallization of the front side and of the back side are carried out.

The wet-chemical treatment of the front side and the subsequent doping of the front side may alternatively be carried out after step b2). The doping of the front side in this case may be carried out simultaneously with the annealing, since the doping and the annealing are carried out in a similar temperature range. The annealing is additionally followed by the passivation of the front side and of the back side and then by the metallization of the front side and of the back side.

The Si or SiC layer generated in step b2) may be doped in situ in step b2). Alternatively the silicon or SiC layer generated in step b2) may be doped after step b2) by ex situ doping of the back side using POCl, for example. The ex situ doping of the back side may be carried out simultaneously with the annealing. The back-side doping and the annealing may be carried out in the same or a similar temperature range.

The wet-chemical treatment preferably comprises etching of cutting damage, and texturing. The doping of the front side preferably comprises the introduction of an emitter into the front side of the substrate, such as introduction of a boron emitter in the case of an n-type substrate or introduction of a phosphorus emitter in the case of a p-type substrate. The further wet-chemical treatment preferably comprises a CEI (chemical etch insulation) and BSG (borosilicate glass) or PSG (phosphosilicate glass)-etch. The annealing preferably constitutes a high-temperature treatment in the region of a temperature from 700 to 1000° C. With this high-temperature treatment, a polycrystalline silicon layer or SiC layer is formed from the substantially amorphous silicon or SiC layer generated in step b2), and optionally the dopant is diffused out of this silicon or SiC layer into the oxide layer and the near-surface region of the substrate.

The optional yet further wet-chemical treatment comprises removal of the wraparound of the polycrystalline silicon or SiC layer on the front side, insofar as said wraparound is present. The removal of the wraparound on the front side, if present, may also take place by other than wet-chemical means, such as by laser ablation of the layer or laser separation, for example. Passivation of the front side preferably comprises the formation of an AlOx and/or SiNx layer on the front side of the substrate. Passivation of the back side preferably comprises formation of an SiNx and/or SiOxNy layer on the back side of the substrate. The metallization of the front side and of the back side preferably comprises the application of silver to the front side and back side, respectively, of the substrate by screen-printing. The metallization may be carried out over the whole area or part of the area, as a lattice, for example.

The deposition apparatus is preferably a tube furnace. The tube furnace is arranged in principle as a heatable tube of a PECVD plant and has corresponding required connections for the gases to be introduced that are needed for the method, and for evacuation and/or aeration, and also electrical lead-throughs from the plasma generator to the boat for igniting the plasma. The use of the tube furnace has the advantage, moreover, that there is relatively little parasitic deposition of Si or SiC layers on a chamber wall of the tube furnace, and so cleaning of the chamber wall to remove the amorphous Si or SiC layers by means of plasma etching using, for example, $NF_3$/Ar plasmas is unnecessary or is necessary only at relatively long time intervals.

BRIEF DESCRIPTION OF THE DRAWINGS

The invention is elucidated in more detail below with reference to the appended drawings. Schematically and in a form not true to scale.

DETAILED DESCRIPTION

Figures 1A, 1B, 1C:
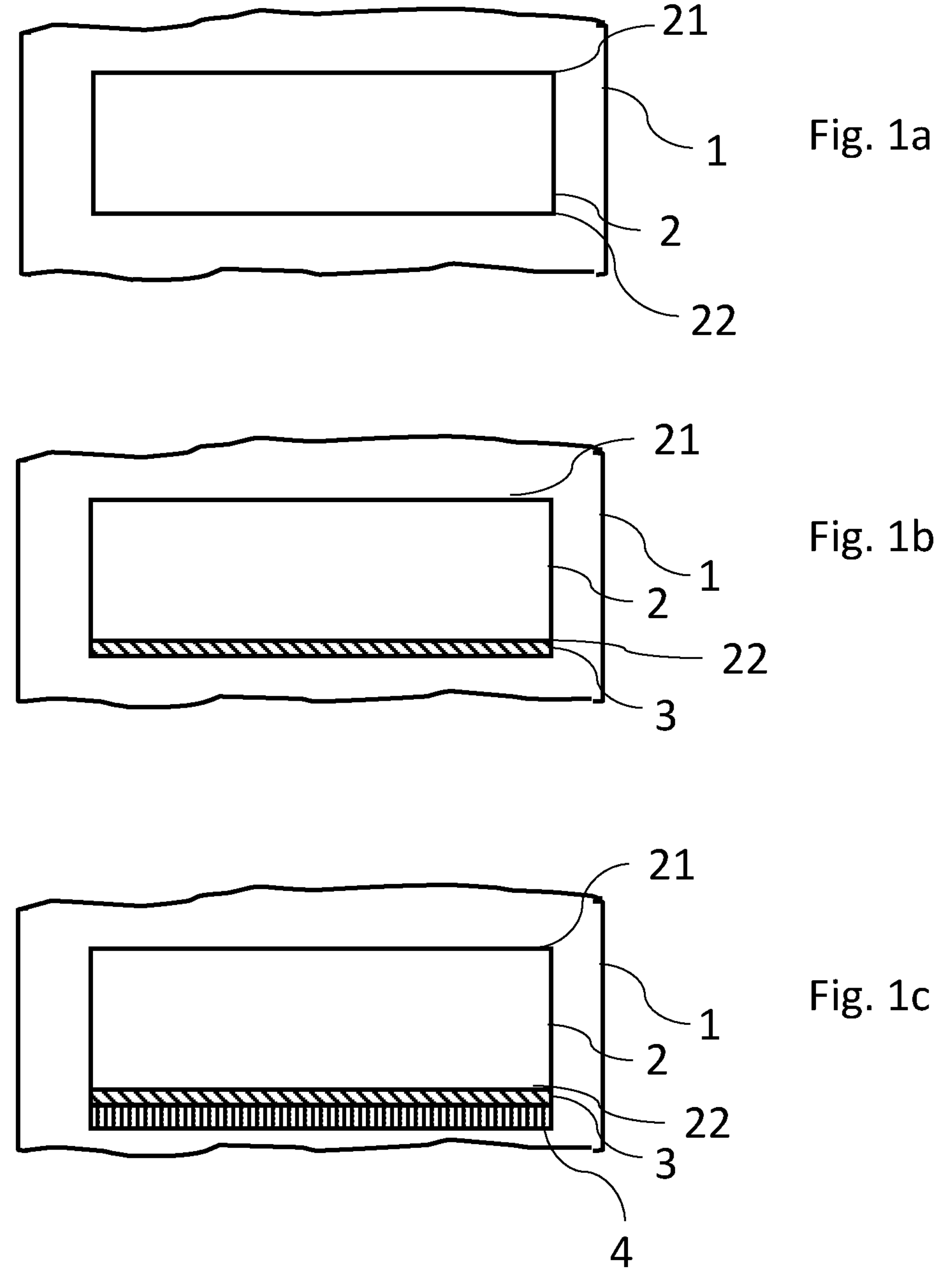
FIGS. 1*a* to 1*c* each show a step of a method of the invention, with the deposition apparatus and the substrate being shown in cross section.

FIGS. 1*a* to 1*c* each show a step of a method of the invention, with the deposition apparatus and the substrate being shown in cross section.

FIG. 1*a* shows a step a) of providing a substrate 2 having a front side 21 and a back side 22 in a deposition apparatus 1. The substrate illustratively is a silicon substrate.

FIG. 1*b* shows a step b1), following on from step a), of oxidizing the substrate by exposing it to an oxygen-containing gas and to a first plasma to generate an oxide layer 3. If the oxygen-containing gas is the only process gas supplied in step b1), then the silicon substrate is oxidized on its back side 22 to form a silicon oxide layer as oxide layer 3. In step b1) the substrate may as well as the oxygen-containing gas one or more further gases. The further gas may be an inert gas. The further gas may also, for example, be an aluminum-containing gas, so forming an aluminum oxide layer as oxide layer 3 on the back side 22 of the substrate 2.

FIG. 1*c* shows a step b2), following on from step b1), of subsequently depositing a silicon layer 4 or SiC layer on the oxide layer 3 located on the back side 22, by exposing it to a silicon-containing gas, an optional carbon-containing gas and a second plasma.

Steps b1) and b2) are part of a step b), wherein the substrate 2 is coated in situ with the two layers 3 and 4. Step b) is carried out under vacuum in the deposition apparatus 1, with the vacuum being maintained throughout step b) and the substrate 2 not being spatially moved.

Figure 2:
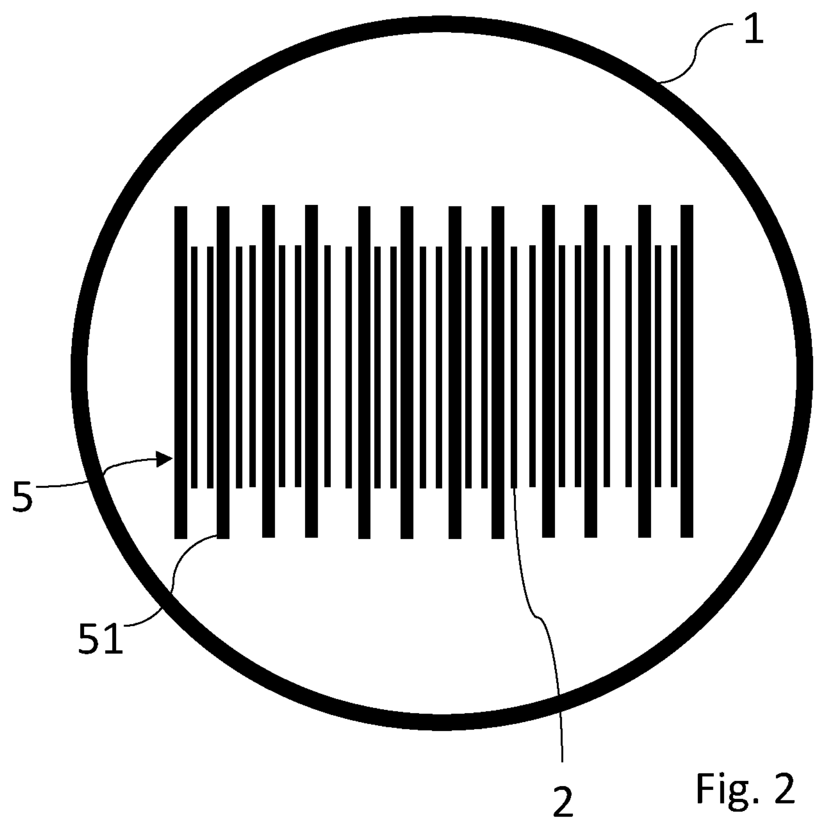
FIG. 2 shows a cross-sectional view of a variant of the step shown in FIG. 1*a;*

FIG. 2 shows a cross-sectional view of a variant of the step shown in FIG. 1*a*. In the deposition apparatus 1, two or more substrates 2 are provided in a boat 5. The substrates 2 provided in the boat 5 are in this arrangement subjected subsequently also to the steps shown in FIGS. 1*b* and 1*c*, with this not being shown here. In the boat 5, pairs of substrates 2 are arranged oppositely and have a different polarity. The boat 5 has a plurality of carrier plates 51, arranged parallel to one another, for carrying the two or more substrates 2 during steps a) and b), with the carrier plates 51 being insulated from one another and connected alternately to connections of an alternating-voltage generator (not shown).

The carrier plates 51 have a suitable mounting (not shown) such as, for example, substrate pockets, retaining pins or the like, in order to hold the substrates 2, with the individual substrates 2 being held at a distance from one another in the holding apparatus so as to enable an extremely uniform flow of gases in step b) through all of the interstices, and the formation of a plasma between the substrates 2, in order to ensure uniform coating of the substrates 2.

Figure 3:
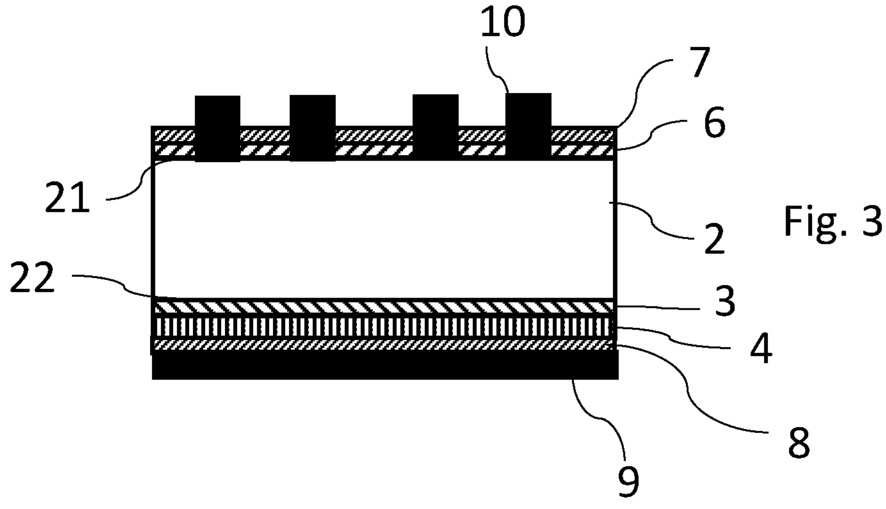
FIG. 3 shows a cross-sectional view of a solar cell produced by means of a further method of the invention.

FIG. 3 shows a cross-sectional view of a solar cell produced by a further method of the invention. The solar cell has a substrate 2 having a front side 21 and a back side 22. On the front side 21, the substrate 2 bears a doping layer 6 such as a boron emitter or phosphorus emitter. On a side of the doping layer 6 facing away from the substrate 2, there is also a front side passivating layer 7, which may have a single-layer or multilayer configuration. The front side passivating layer 7 has, for example, a layer of AlOx and a layer of SiNx. On a side of the front side passivating layer 7 facing away from the substrate 2 there is also a front side metallization 10 arranged.

The back side 22 of the substrate 2 bears a layer stack as follows. Arranged on the back side 22 is an oxide layer 3, with a silicon or SiC layer 4 arranged on the substrate-facing side thereof. On a side of the silicon or SiC layer 4 facing away from the substrate 2 there is also a back side passivating layer 8 arranged, which may have a single layer or multilayer configuration. The back side passivating layer 8 has, for example, a layer of SiNx and a layer of SiNxOy. On a side of the back side passivating layer 8 facing away from the substrate 2 there is also a back side metallization 9 arranged. The solar cell is a TOPCon solar cell, in which the oxide layer 3 is configured as a tunnel layer.

Figure 4:
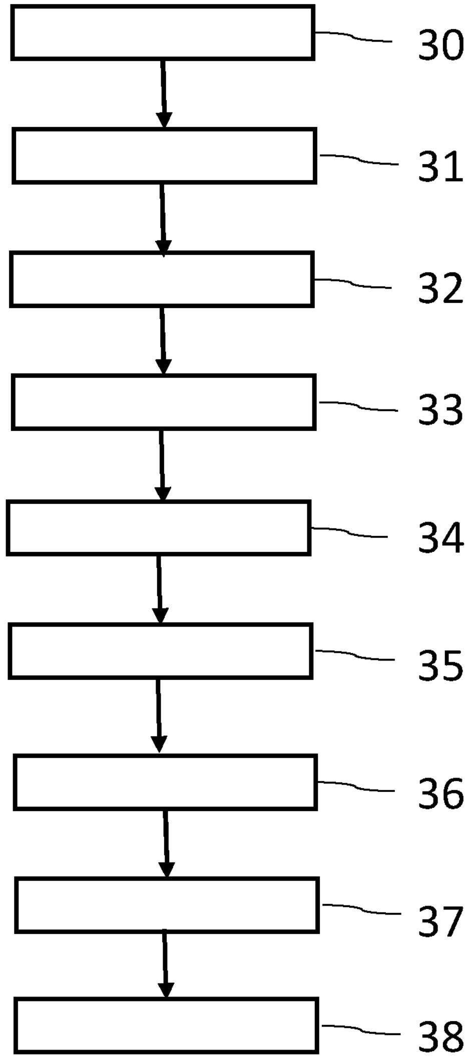
FIG. 4 shows a flow diagram of the method by which the solar cell shown in FIG. 3 is produced.

FIG. 4 shows a flow diagram of the method by which the solar cell shown in FIG. 3 is produced. In one step a substrate having a front side and a back side is subjected to a wet-chemical treatment 30—for example, to cutting-damage etching and texturing. In a step following on from the wet-chemical treatment 30, the front side of the substrate undergoes doping 31 to form, for example, a boron or phosphorus emitter. In a step following on from the doping 31, the substrate is subjected to a further wet-chemical treatment 32 such as CEI and BSG or PSG etching. In a step a) 33, following on from the wet-chemical treatment 32, the substrate is provided in a deposition apparatus. In a step b) 34 following on from the step a) 33, first an oxide layer and then a silicon or SiC layer are deposited on the back side of the substrate, with the formation of these layers being carried out under vacuum by in situ coating in the deposition apparatus, with the vacuum being maintained throughout step b) 34 and the substrate not being moved spatially.

A step following on from step 34 comprises an annealing 35, in which a high-temperature treatment is carried out in the range from a temperature of 700 to 1000° C., so that a polycrystalline silicon or SiC layer is generated from the substantially silicon or SiC layer generated in step b) 34, and any dopants (e.g., phosphorus or boron) present in the silicon or SiC layer diffuse through the oxide layer into the substrate. A step following on from the annealing 35 exhibits yet further wet-chemical treatment 36 of the front side, in the course of which any wraparound of the polycrystalline silicon (carbide) layer on the front side is removed. The yet further wet-chemical treatment 36 is followed by a passivation 37 of the front side and of the back side and then by metallization 38 of the front side and of the back side.

LIST OF REFERENCE SIGNS

1 deposition apparatus
2 substrate
21 front side
22 back side
3 silicon oxide layer
4 silicon layer
5 boat
51 retaining plate
6 doping layer
7 front-side passivating layer

8 back-side passivating layer
9 back-side metallization
10 front-side metallization
30 wet-chemical treatment
31 doping
32 further wet-chemical treatment
33 step a)
34 step b)
35 annealing
36 yet further wet-chemical treatment
37 passivation
38 metallization

The invention claimed is:

1. A method for producing a solar cell, comprising steps as follows:

a) providing a substrate having a front side and a back side in a deposition apparatus, and b) coating the substrate in situ with two layers, comprising:

b1) oxidizing the substrate by exposing it to an oxygen-containing gas and to a first plasma, to generate an oxide layer, or depositing the oxide layer by PECVD, and b2) subsequently depositing a silicon layer or SiC-layer by exposure to a silicon-containing gas, an optional carbon-containing gas and a second plasma, wherein step b) is carried out under vacuum in the deposition apparatus and the vacuum is maintained throughout step b); and wherein step b) is carried out with a low-pressure plasma having a pressure in a range from 0.1 to 5.0 mbar or 0.1 to 10.0 mbar and/or step b) is carried out with a low-pressure glow discharge having an excitation frequency in a range from 10 to 500 kHz or 30 to 50 kHz and/or in step b) the plasma is pulsed in a range with a duty cycle of $T_{on}/(T_{on}+T_{off})<10\%$ and/or in a range of $T_{on}=1$ to 100 ms.

2. The method as claimed in claim 1, wherein the back side is subjected to steps a) and b).

3. The method as claimed in claim 1, wherein between steps b1) and b2) the substrate is not moved spatially within the deposition apparatus.

4. The method as claimed in claim 1, wherein:

the oxygen-containing gas is selected from a group consisting of:

$O_2$, a gas mixture of $O_2$/inert gas, the inert gas being preferably Ar, Ne, Kr or $N_2$, an oxygen-containing molecular gas, which is preferably $N_2O$, $CO_2$, $NO_2$, NO or CO, and a layer-forming gas mixture, the layer-forming gas mixture being preferably $SiH_4/O_2$, $SiH_4/CO_2$, $AlC_3H_9/N_2O$ or $AlC_3H_9/N_2O/Ar$, and/or:

the silicon-containing gas and the optional carbon-containing gas are selected from the group consisting of a gas mixture of $SiH_4/H_2$, a gas mixture of $SiH_4/H_2/PH_3$, a gas mixture of $SiH_4/H_2/B_2H_6$, a gas mixture of $SiH_4/CH_4$, a gas mixture of $SiH_4/CH_4/PH_3$ or a gas mixture of $SiH_4/CH_4/B_2H_6$.

5. The method as claimed in claim 4, wherein the oxygen-containing molecular gas is $N_2O$, $CO_2$, $NO_2$, NO or CO.

6. The method as claimed in claim 4, wherein the layer-forming gas mixture is $SiH_4/O_2$, $SiH_4/CO_2$, $AlC_3H_9/N_2O$ or $AlC_3H_9/N_2O/Ar$.

7. The method as claimed in claim 4, wherein the inert gas is Ar, Ne, Kr or $N_2$.

8. The method as claimed in claim 1, wherein step b1) is carried out with a deposition rate of <0.2 nm/s or <0.1 nm/s and/or step b1) is carried out with a duty cycle<5% and/or step b1) is carried out at a temperature<500° C. or in a range from 300 to 450° C.

9. The method as claimed in claim 8, wherein two or more substrates are arranged in a boat in which pairs of substrates are arranged oppositely and have a different polarity.

10. The method as claimed in claim 1, wherein two or more substrates are subjected simultaneously to steps a) and b).

11. The method as claimed in claim 1, wherein the oxide layer generated in step b1) is configured as a tunnel layer and/or the solar cell is a TOPCon solar cell.

12. The method as claimed in claim 1, wherein the method is carried out as a direct plasma process or as a remote plasma process with a capacitive plasma as radiofrequency plasma or with an excitation frequency of 13.56 MHz or multiples thereof.

13. The method as claimed in claim 1, wherein before step a) with the substrate first a wet-chemical treatment, then a doping for the front side and subsequently a further wet-chemical treatment are carried out and after step b) with the substrate an annealing, then yet a further wet-chemical treatment of the front side, subsequently a passivation of the front side and of the back side and then a metallization of the front side and of the back side are carried out.

14. The method as claimed in claim 1, wherein the deposition apparatus is a tube furnace.

15. A method for producing a solar cell, comprising steps as follows:

a) providing a substrate having a front side and a back side in a deposition apparatus, and b) coating the substrate in situ with two layers, comprising:

b1) oxidizing the substrate by exposing it to an oxygen-containing gas and to a first plasma, to generate an oxide layer, or depositing the oxide layer by PECVD, and b2) subsequently depositing a silicon layer or SiC-layer by exposure to a silicon-containing gas, an optional carbon-containing gas and a second plasma, wherein step b) is carried out under vacuum in the deposition apparatus and the vacuum is maintained throughout step b), and wherein:

the oxygen-containing gas is selected from a group consisting of:

$O_2$, a gas mixture of $O_2$/inert gas, the inert gas being preferably Ar, Ne, Kr or $N_2$, an oxygen-containing molecular gas, which is preferably $N_2O$, $CO_2$, $NO_2$, NO or CO, and a layer-forming gas mixture, the layer-forming gas mixture being preferably $SiH_4/O_2$, $SiH_4/CO_2$, $AlC_3H_9/N_2O$ or $AlC_3H_9/N_2O/Ar$, and/or:

the silicon-containing gas and the optional carbon-containing gas are selected from the group consisting of a gas mixture of $SiH_4/H_2$, a gas mixture of $SiH_4/H_2/PH_3$, a gas mixture of $SiH_4/H_2/B_2H_6$, a gas mixture of $SiH_4/CH_4$, a gas mixture of $SiH_4/CH_4/PH_3$ or a gas mixture of $SiH_4/CH_4/B_2H_6$.

16. The method as claimed in claim 15, wherein the inert gas is Ar, Ne, Kr or $N_2$.

17. The method as claimed in claim 15, wherein the oxygen-containing molecular gas is $N_2O$, $CO_2$, $NO_2$, NO or CO.

18. A method for producing a solar cell, comprising steps as follows:

a) providing a substrate having a front side and a back side in a deposition apparatus, and b) coating the substrate in situ with two layers, comprising:

b1) oxidizing the substrate by exposing it to an oxygen-containing gas and to a first plasma, to generate an oxide layer, or depositing the oxide layer by PECVD, and b2) subsequently depositing a silicon layer or SiC-layer by exposure to a silicon-containing gas, an optional carbon-containing gas and a second plasma, wherein step b) is carried out under vacuum in the deposition apparatus and the vacuum is maintained throughout step b); and wherein step b1) is carried out with a deposition rate of $<0.2$ nm/s or $<0.1$ nm/s and/or step b1) is carried out with a duty cycle $<5\%$ and/or step b1) is carried out at a temperature $<500°$ C. or in a range from 300 to 450° C.

19. The method as claimed in claim 18, wherein two or more substrates are arranged in a boat in which pairs of substrates are arranged oppositely and have a different polarity.

20. The method as claimed in claim 18, wherein two or more substrates are subjected simultaneously to steps a) and b).

* * * * *